(12) United States Patent
Sassoon

(10) Patent No.: US 6,198,700 B1
(45) Date of Patent: Mar. 6, 2001

(54) METHOD AND APPARATUS FOR RETIMING TEST SIGNALS

(75) Inventor: Leonid B. Sassoon, Gold River, CA (US)

(73) Assignee: Level One Communications, Inc., Sacremento, CA (US)

( * ) Notice: Subject to any disclaimer, the term of this patent is extended or adjusted under 35 U.S.C. 154(b) by 0 days.

(21) Appl. No.: 09/325,874

(22) Filed: Jun. 4, 1999

(51) Int. Cl.[7] .............................. G04F 8/00; G04F 10/00; G03L 7/00; H04L 7/00
(52) U.S. Cl. ......................... 368/113; 368/120; 327/141; 327/161; 375/354; 375/371
(58) Field of Search .................................... 368/113, 118, 368/120; 372/141, 144, 161, 163; 375/354, 356, 371, 373

(56) References Cited

U.S. PATENT DOCUMENTS

| | | | | |
|---|---|---|---|---|
| 5,036,529 | * | 7/1991 | Shin | 375/119 |
| 5,689,533 | * | 11/1997 | Brauns et al. | 375/360 |
| 5,886,552 | * | 3/1999 | Chai et al. | 327/165 |
| 5,930,371 | * | 7/1999 | Lovelace et al. | 375/354 |

* cited by examiner

Primary Examiner—Vit Miska
(74) Attorney, Agent, or Firm—Merchant & Gould P.C.

(57) ABSTRACT

A test signal retiming circuit that captures an input signal to produce a first output signal and generates a second output signal in response to the first output signal and a predetermined reference signal. The second output signal is resistant to an input signal timing variation. A verification is performed to insure the second output signal conforms to timing of a predetermined output signal. The input signal produces the first output signal by acquiring the input signal in a first buffer in response to a first signal and transferring the acquired input signal from the first buffer to a second buffer in response to the first signal. The first output signal is transferred from the second buffer to a third buffer in response to a second signal to produce a second output signal. The second output signal is resistant to a plurality of clock and data skews. A comparison of a predetermined input signal to the second output signal to determine if the second output signal will appear at the output at the predetermined time. The comparison is performed by strobing the second output signal at a predetermined period to compare the strobed sample to the predetermined output value.

34 Claims, 5 Drawing Sheets

METHOD AND APPARATUS FOR RETIMING TEST SIGNALS

BACKGROUND OF THE INVENTION

1. Field of the Invention

This invention relates in general to a method and apparatus for retiming test signals, and more particularly to a test signal retiming circuit that is resistant to timing variations.

2. Description of Related Art

Designers need an easy way to test in order to establish rapid prototyping of designs in a test environment. Test methodologies help a design engineer structure the simulation of a circuit. These test methodologies can efficiently reuse simulation stimuli and response for a real device under test. Also, these modern test approaches increase the efficiency of the engineer in a test environment.

The technological evolution in microelectronics has lead to the ever-increasing complexity of systems integrated on high density chips. Since development and test time should not grow at the same rate as the complexity, new design and test methods are needed.

There's a whole new category of devices that are troubling test engineers in the digital industry. Test systems availability and hardware dependencies are a few limitations that plague a test engineer. To deal with the limitations, many hardware manufactures prefer digital testers as part of their automated test equipment. They also want a consistent testing environment that provides all the digital performance they need and reduces test development time by providing a consistent digital test methodology for all tests.

Manufacturer's need an integrated solution for the high-throughput production test coverage required to ensure quality in digital-dominant integrated circuits. Testing such devices requires the full functionality of a digital tester. Attributes such as high pin counts, high data rates and timing flexibility, combined with digital test methodologies now need to be coupled with the ability to test digital cells.

A digital testing devices has several advantages. It allows the designer to check for design-for-testability success at a much earlier stage during the manufacturing process. Also, errors are discovered before mass production is initiated. This greatly improves the likelihood of a correct designs earlier in an engineering effort.

One important aspect of digital test systems is the ability of the system provide a timing reference signal to detect correct digital output when sampling an output signal. The device must be insensitive to external stimuli and variations in hardware performance. During digital testing using automated test equipment, device inputs are driven by a set of digital vectors and device outputs are strobed by a tester and compared to reference data. Depending on the functionality, design implementation, process variation, tester, loadboard, interface hardware and output data detection, there are significant variations in clock skew and data arrival during clock periods.

For example, a tremendous problem in industrial digital testing is to identify variability of the data arrival and clock skew during the output data detection. Another problem is positioning the test timing strobe to detect a rise and fall of a signal edge consistently. Nevertheless, non-consistency directly effects repeatability of the test process, which in turn presents a problem for high volume production.

With increases in device operating frequencies and reduction in component size, this task becomes even more difficult. Deep submicron processes create further sources of timing variability. Test periods are reduced significantly without improvements in output data detection, and device timing accuracy approaches the automatic test equipment timing resolution.

It can be seen then that there is a need for test signal retiming circuit that consistently detects valid output data.

It can also be seen that there is a need for a test signal retiming circuit that is resistant to timing variations.

It can also be seen that there is a need for a test signal retiming circuit that ensures that the output data consistently is synchronized with the automatic test equipment.

SUMMARY OF THE INVENTION

To overcome the limitations in the prior art described above, and to overcome other limitations that will become apparent upon reading and understanding the present specification, the present invention discloses a test signal retiming circuit that is resistant to timing variations.

The present invention solves the above-described problems by providing a test signal retiming circuit that consistently detects the rise and fall of the signal edge by providing an intermediate test circuit. This test circuit incorporates a test reference clock allowing the output data from a device under test to be valid for a complete test cycle.

A method in accordance with the principles of the present invention includes capturing an input signal to produce a first output signal in response to a first reference signal, generating a second output signal in response to the first output signal and a second reference signal, wherein the second output signal is resistant to an input signal timing variation and verifying that the second output signal appears at an output at a predetermined time.

Other embodiments of a system in accordance with the principles of the invention may include alternative or optional additional aspects. One such aspect of the present invention is that the capturing the input signal to produce the first output signal further includes acquiring the input signal in a first buffer in response to the first reference signal and transferring the acquired input signal from the first buffer to a second buffer in response to the first reference signal.

Another aspect of the present invention is that the first reference signal is generated by a system clock, the first reference signal having a rising edge and a falling edge, the rising edge gating the input signal from the first buffer and the falling edge gating the input signal from the second buffer.

Another aspect of the present invention is that the system clock further produces a timing signal for a component under test.

Another aspect of the present invention is that the generating a secodn output signal further includes the first output signal from the second buffer to a third buffer in response to the second reference signal to produce the second output signal.

Another aspect of the present invention is that the second reference signal is a test clock, the test clock having a rising edge and a falling edge, the rising edge of the test signal signal gating the first output signal into the third buffer to produce the second output signal.

Another aspect of the present invention is that the test clock produces a timing signal, the timing signal being used to compare the second output thereto.

Another aspect of the present invention is that the verifying further includes comparing a predetermined signal to the second output signal and determining if the second output signal matches the predetermined signal.

Another aspect of the present invention is that the determining if the second output signal matches the predetermined signal further includes sampling the second output signal at a predetermined period to compare the sample to the predetermined signal.

Another aspect of the present invention is that the second output signal includes minimal skew.

Another aspect of the present invention is that the skew of the second output signal further includes a plurality of clock and data skews.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further path hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The primary design issues of a test signal retiming circuit is to reduce development costs, time required for developmental and production testing, and improve test yields for actual production by providing a test signal retiming circuit that is resistant to timing variations.

During a test procedure using automated test equipment (ATE), all output timing events are interpreted with respect to a test reference clock period. Actual device output data is driven by an internal system clock associated with that particular output. Internal clock and data skews may cause the actual output data signal to vary significantly during each iteration of a test cycle. Various reason, such as design, layout and process variations can cause this shift in the actual output timing signal. A concern of a digital circuit tester is the ability to locate the output signal edges when the signal is gated by the system clock during data sampling. Also, how long the data will stay valid at the output. The test clock provides a way to synchronize the output data signal edges with respect to the test reference clock. Edge detection becomes critical, especially for production utilizing automated test equipment, because it will dramatically effect production yields. The test signal retiming circuit is an intermediate circuit which will latch the device output and allow the data to be displayed at the output and stay valid for the entire test cycle.

According to the present invention, a test signal retiming circuit is inserted between primary outputs and an input/output (I/O) pad of the top level circuitry. The test signal retiming circuit has two modes of operation: a normal (functional) mode, wherein the output goes directly to the pad via multiplexer, and a test mode, wherein the output is redirected to the test signal retiming circuit path. The output then is gated to the pad via the test clock.

Figure 1:
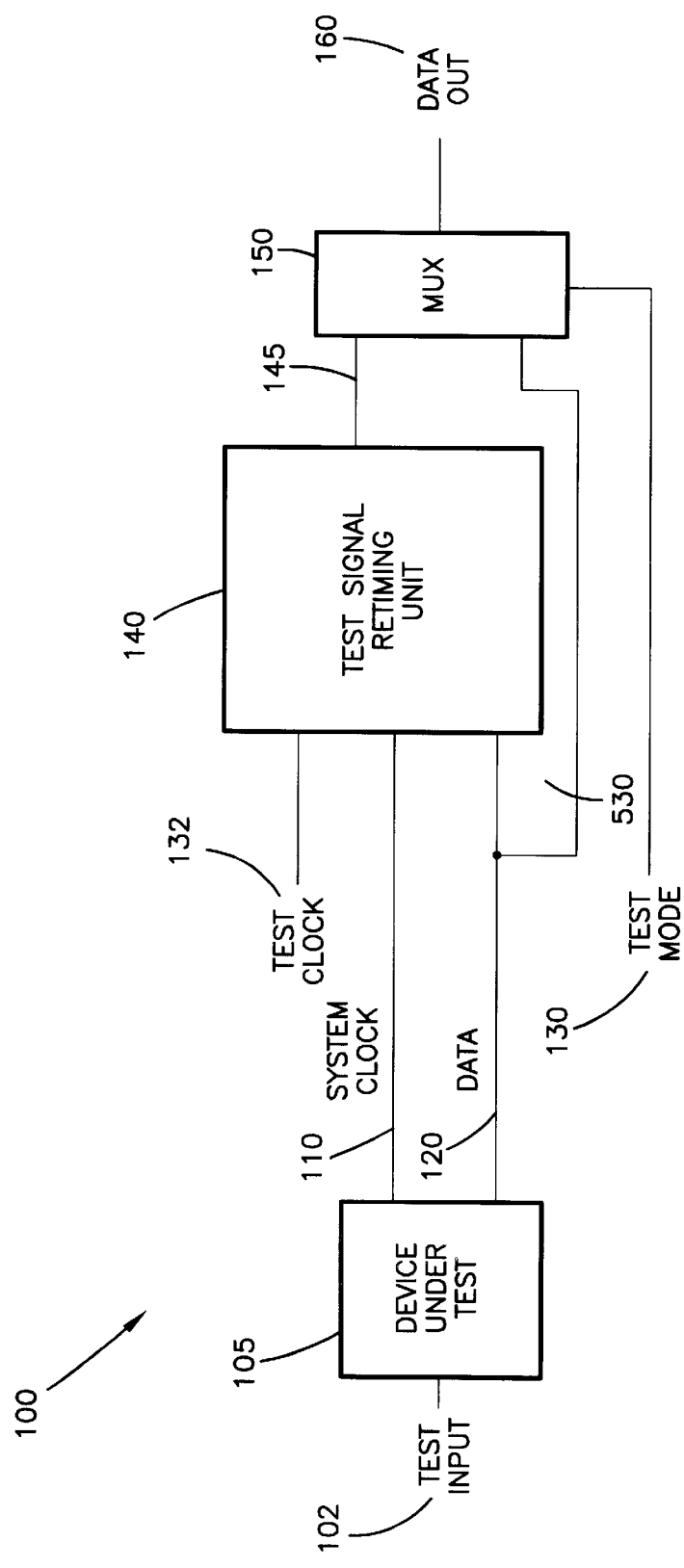
FIG. 1 is a system block diagram of a test signal retiming circuit.

FIG. 1 is a system block diagram of a test signal retiming circuit 100. The test signal retiming circuit is a bidirectional circuit intermediate of a device under test 105 and a test pad (not shown) at the data output 160. A predetermined test input 102 is applied to the device under test 105. The system clock 110 is used to gate the normal functions of the device under test 105. The test clock 132 is used to gate the data into a last stage of the test signal retiming unit 140 to allow a second modified system data 145 to be synchronized with the test clock 132. The test mode signal 130 is used to switch via a multiplexor 150 between the test signal retiming unit output 145 and the device under test data output 120 which is also directly provided to the multiplexor 150.

In the normal mode of operation the data circumvents the test signal retiming unit 140 and is utilized directly by subsequent circuitry via the multiplexer 150. In the test mode, the data 120, is redirected through the retiming unit 140 where it is gated to the test pad using the test clock 132. Any data 120 passing through the test signal retiming circuitry will be delayed, preferably by two clock cycles. This allows the data to be valid for a whole test cycle at the output 160 of the retiming circuitry 100. The test signal retiming circuit 100 is a bidirectional circuit allowing data flow in either direction. In the forward direction the data may be passed through the test signal retiming circuitry or bypass the test signal retiming circuitry. In the reverse direction, the data is allowed to bypass the test signal retiming circuitry.

Figure 2:
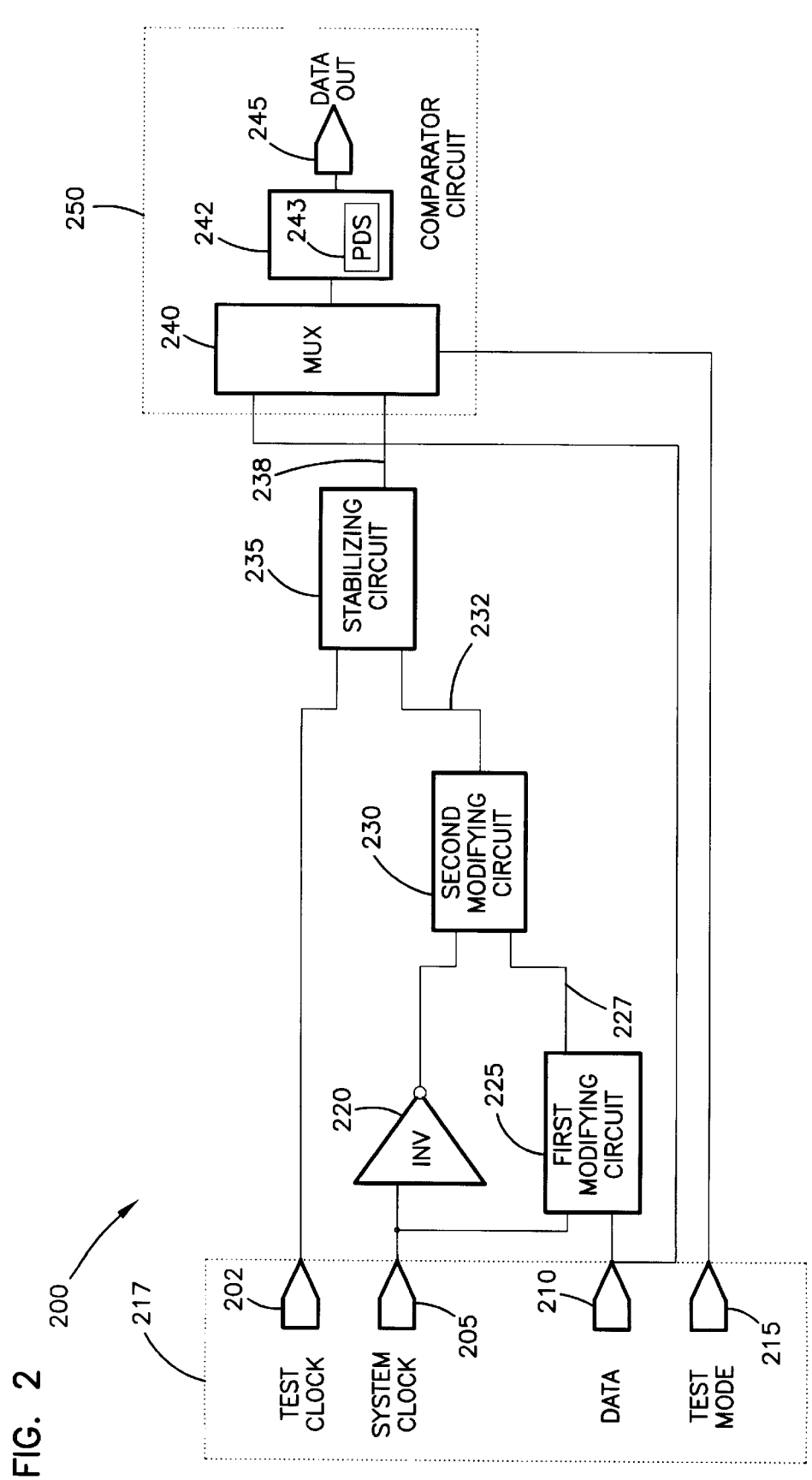
FIG. 2 is a detailed hardware diagram of the test signal retiming circuit.

FIG. 2 is a detailed hardware diagram of the test signal retiming circuit 200 and verification circuit 250. Data 210 received at the input region 217 from the output of the device under test is modified to produce a modified data output 227. The modified data output 227 is available at the output of a first modifying circuit 225 in response to the rising edge of a system clock pulse 205. The modified data output 227 is provided to a second modifying circuit 230. A first output signal 232 is available at the output of a second modifying circuit 230 in response to the falling edge of the system clock pulse 205. This master-slave relationship captures the input signal 210 and provides a stable signal 232 for approximately one complete system clock cycle.

The first output 232 is further modified via a stabalizing circuit 235 to produce a second output 238. This second output 238 is available at the output of the stabilizing circuit 235 in response to the rising edge of the test clock 202. The output 238 of the stabilizing circuit 235 is detected in the verification circuit 250. A multiplexer 240 receives the second output 238. The second output 238 is compared to a predetermined signal by comparator circuit 240 to determine if the device under test is functioning properly, i.e., the second output signal 238 is appearing at the output 245 at a predetermined time determined by the predetermined signal 243.

The test signal retiming circuit 200 has two modes of operation, a normal mode and a test mode which are selected by test mode signal 215. In the normal mode, data 210 is routed directly to the multiplexor 240 thereby bypassing the test signal retiming circuitry 200 and is displayed at the output 245. In the test mode, the data 210 is redirected through the test signal retiming circuitry 200 and is then displayed at the output 245.

Figure 3:
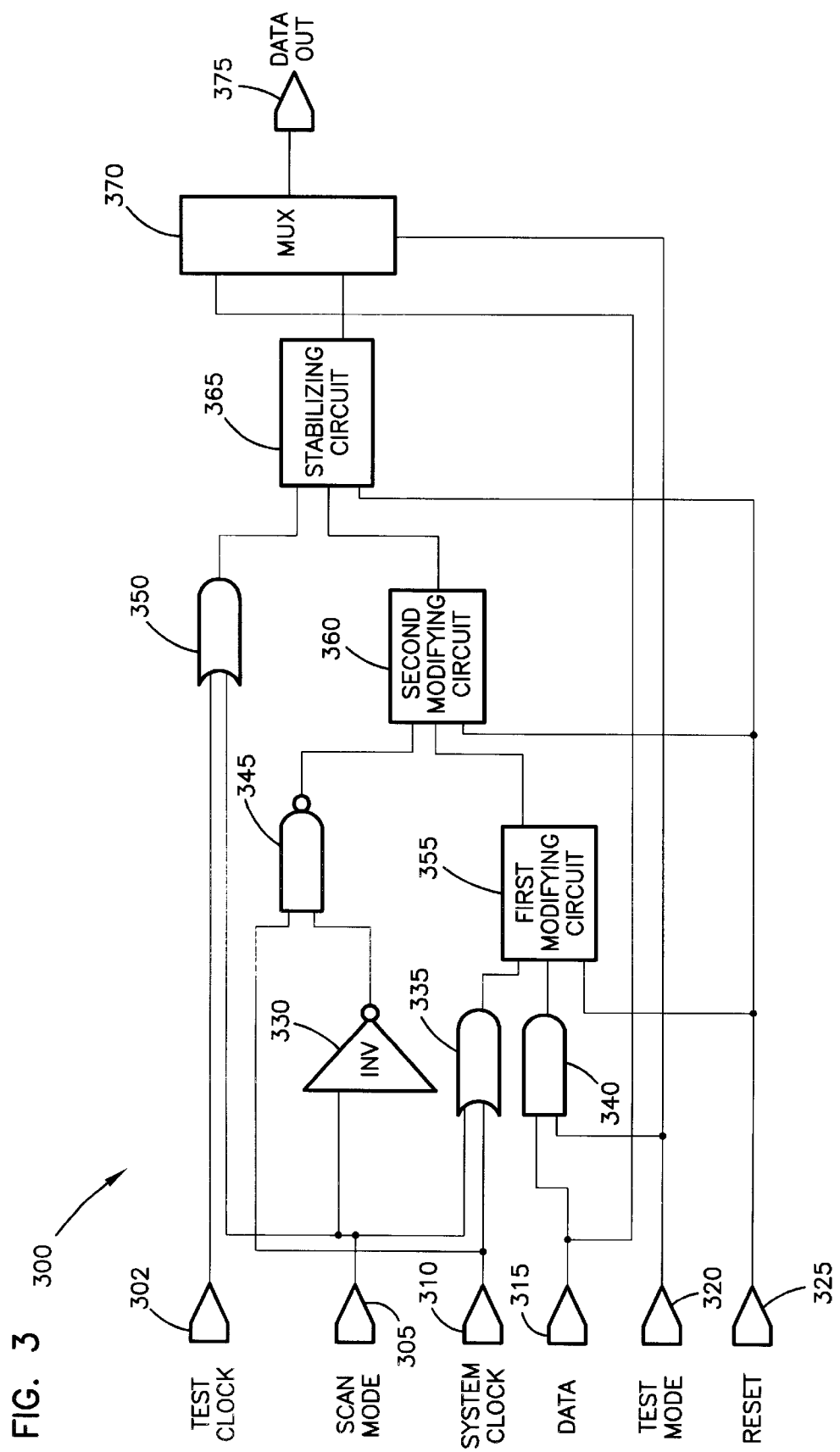
FIG. 3 is an exemplary hardware diagram showing an embodiment of the test signal retiming circuit in a typical digital circuit.

FIG. 3 is an exemplary hardware diagram showing the test signal retiming circuitry 300 in a typically digital circuit. In the test mode, data 315 is routed through an AND gate 340 into the modifying circuit 355 in response to the rising edge of the system clock 310. In this master-slave section of the test signal retiming circuit 300, the data 310 is transferred from the first modifying circuit 355 to the second modifying circuit 360 in response to the falling edge of the system clock 310 via a NAND gate 345. The NAND gate 345 allows the correct polarity of the system clock signal 310 to be sensed by the second modifying circuit 360 thus gating the data 310 via the second modifying circuit 360 on the correct edge of the system clock 310. Further, the data 310 is transferred to the stabilizing circuit 365 in response to the test clock 302 via an OR gate 350. At this point the data 310 is stable and is available at the data output 375 via the multiplexer 370. In the normal mode 320 the data 310 is redirected via the multiplexer to the data output pin 375 bypassing the test signal retiming circuitry 300. The reset signal 325 allows the three modifying circuits 355, 360, 365 to be reset thus clearing the data buffers. In this embodiment, a scan mode 305 is implemented to check the functionality of the components in the test signal retiming circuitry 300.

Figure 4:
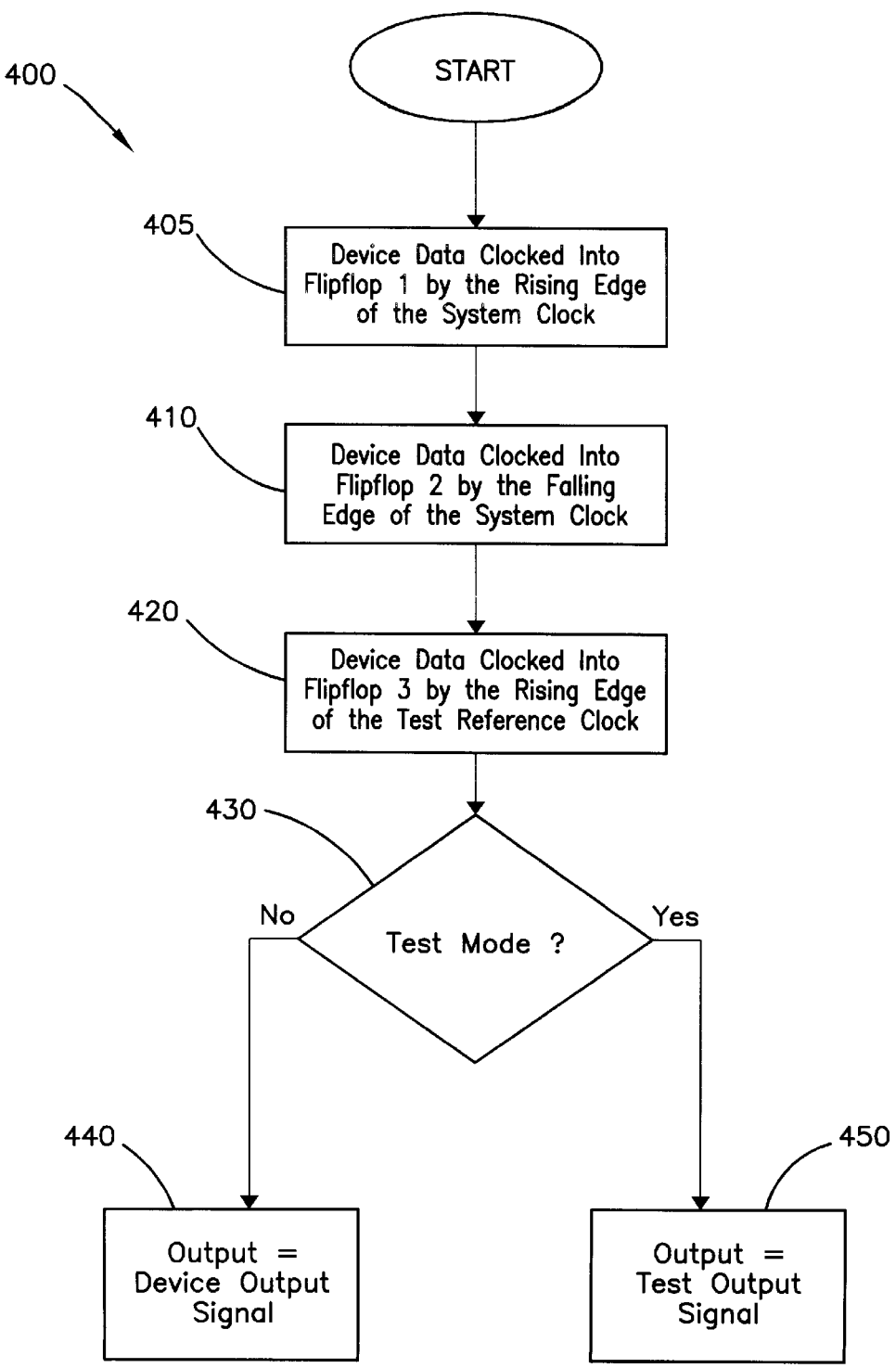
FIG. 4 is a flow diagram illustrating a general signal transition through the test signal retiming circuit.

FIG. 4 is a flow diagram illustrating a general signal transition through the test signal retiming circuitry 400. Data is acquired by the first modifying circuit in response to the rising edge of the system clock 405. The data is then transferred to the second modifying circuit in response to the falling edge of the system clock 410. The data is then transferred to the third modifying circuit in response to the rising edge of the test clock 420. The mode of operation is determined allowing the multiplexer to route the second output signal. If the circuit is functioning in the test mode, the second output signal is obtained through the test signal retiming circuitry and displayed on the output test bed 450. If the circuit is operating in normal mode, the data input signal bypasses the test signal retiming circuitry and is displayed at the output pad 440.

Figure 5:
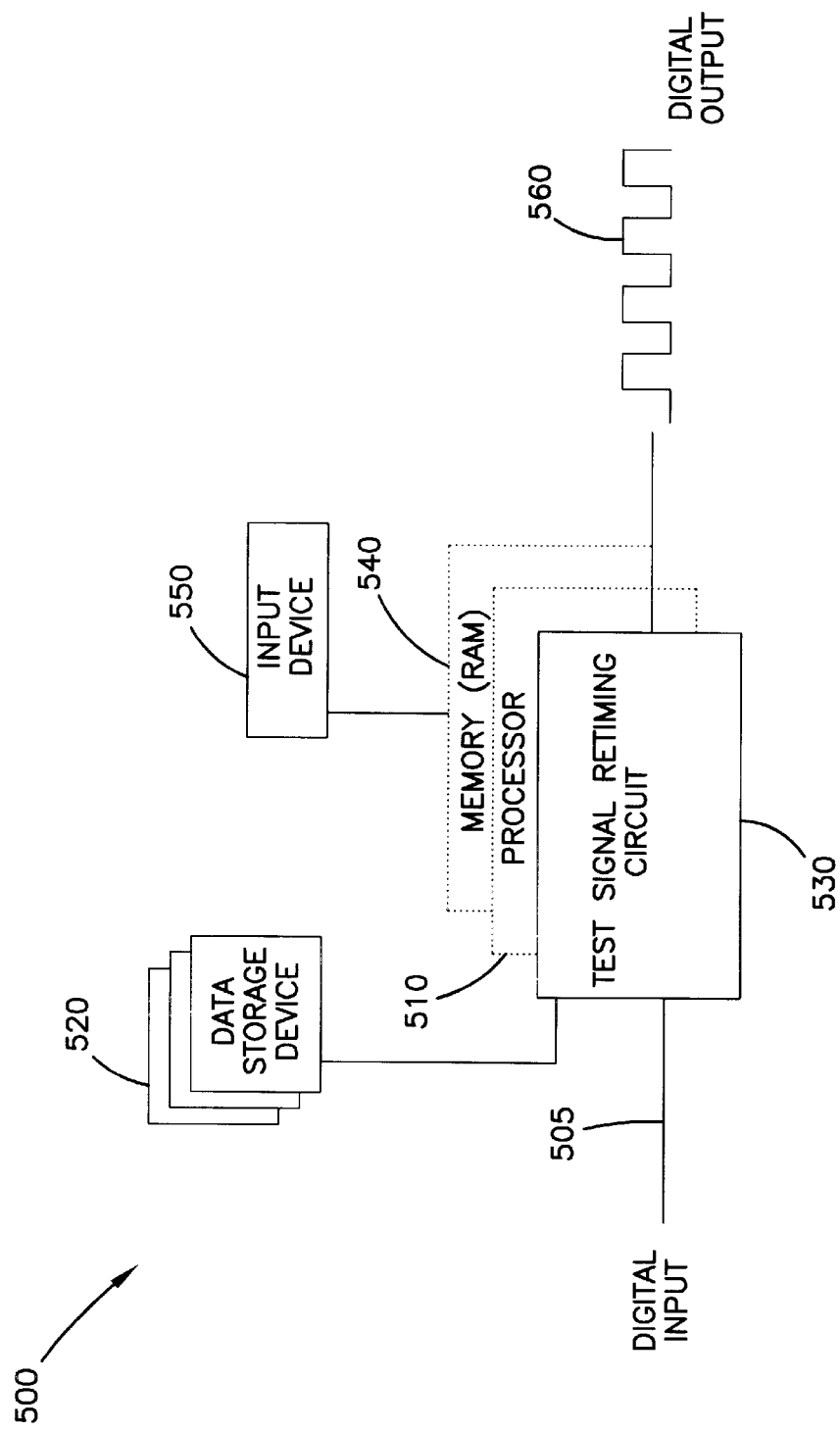
FIG. 5 is an exemplary hardware environment for the test signal retiming circuit.

Referring to FIG. 5, another hardware environment for testing a signal from a sources 505 is shown according to the present invention 500. The present invention may be implemented using a test signal retiming circuit 530, comprised of a processor 510 and memory (RAM) 540. It is envisioned that attached to the circuit 530 may be a memory device 540. Also included in this embodiment may be input devices 550, for downloading data and commands.

The test signal retiming circuit 530 may operate under the control of an operating system. The test signal retiming circuit 530 executes one or more computer programs under the control of the operating system.

Generally, the operating system and the test signal retiming circuit programs may be tangibly embodied in a computer-readable medium or carrier, e.g. one or more of the fixed or removable data storage devices 520, or other data storage or data communications devices. Both operating system and the computer programs may be loaded from the data storage devices into the memory 540 of the test signal retiming circuit 530 for execution by the processor 510. Those skilled in the art will recognize that the memory 540 is optional, or may be a memory device embedded or otherwise couple to the test signal retiming circuitry 530. Both the operating system and the detector programs comprise instructions which, when read and executed by the processor 510, cause the test signal retiming circuit to perform the steps necessary to execute the steps or elements of the present invention.

Although one test signal retiming circuit configuration is illustrated in FIG. 5, those skilled in the art will recognize that any number of different configurations performing similar functions may be used in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of testing a signal from a source, comprising:
   capturing an input signal to produce a first output signal in response to a first reference signal;
   generating a second output signal in response to the first output signal and a second reference signal, wherein the second output signal is resistant to an input signal timing variation; and
   verifying that the second output signal appears at an output at a predetermined time.

2. The method of claim 1, wherein the capturing the input signal to produce the first output signal further comprises acquiring the input signal in a first buffer in response to the first reference signal and transferring the acquired input signal from the first buffer to a second buffer in response to the first reference signal.

3. The method of claim 2, wherein the first reference signal is generated by a system clock, the first reference signal having a rising edge and a falling edge, the rising edge gating the input signal from the first buffer and the falling edge gating the input signal from the second buffer.

4. The method of claim 3, wherein the system clock further produces a timing signal for a component under test.

5. The method of claim 2 wherein the generating a secodn output signal further comprises the first output signal from the second buffer to a third buffer in response to the second reference signal to produce the second output signal.

6. The method of claim 5, wherein the second reference signal is a test clock, the test clock having a rising edge and a falling edge, the rising edge of the test signal signal gating the first output signal into the third buffer to produce the second output signal.

7. The method of claim 6, wherein the test clock produces a timing signal, the timing signal being used to compare the second output thereto.

8. The method of claim 1, wherein the verifying further comprises comparing a predetermined signal to the second output signal and determining if the second output signal matches the predetermined signal.

9. The method of claim 8, wherein the determining if the second output signal matches the predetermined signal further comprises sampling the second output signal at a predetermined period to compare the sample to the predetermined signal.

10. The method of claim 1, wherein the second output signal comprises minimal skew.

11. The method of claim 10, wherein the skew of the second output signal further comprises a plurality of clock and data skews.

12. A retiming circuit for testing a signal from a source comprising:
   a first capturing circuit for capturing an input signal to produce a first output signal in response to a first reference signal;
   a stabilizing circuit, coupled to the capturing circuit, for generating a second output signal in response to the first output signal and a second reference signal, wherein the second output signal is resistant to an input signal timing variation; and
   a verification circuit, coupled to the stabilizing circuit, for verifying that the second modified output signal conforms to a predetermined timing of an output signal.

13. The retiming circuit of claim 12 wherein the capturing circuit further comprises a first buffer for acquiring the input signal, gating the input signal in response to a first reference signal and transferring the acquired input signal from the first buffer to a second buffer in response to the first reference signal.

14. The retiming circuit of claim 13, wherein the first reference signal is generated by a system clock, wherein the system clock has a rising edge and a falling edge, the rising edge gating the input signal from the first buffer and the falling edge gating the input signal from the second buffer.

15. The retiming circuit of claim 14, wherein the system clock further produces a timing signal for a component under test.

16. The retiming circuit of claim 14, wherein the second buffer transfers the first output signal to the stabilizing circuit in response to a second reference signal to produce the second output signal.

17. The retiming circuit of claim 16, wherein the second reference signal is a test clock, wherein the test clock has a rising edge for gating the first output signal from the stabilizing circuit to produce the second output signal.

18. The retiming circuit of claim 17, wherein the test clock produces a timing signal to compare the second output thereto.

19. The retiming circuit of claim 12, wherein the verification circuit further comprises a comparator circuit for comparing a predetermined signal to the second output signal to determine if the second output signal matches the predetermined signal.

20. The retiming circuit of claim 19, wherein the comparator circuit compares the second output signal to the predetermined signal at a predetermined period.

21. The retiming circuit of claim 12, wherein the second output signal comprises minimal skew.

22. The retiming circuit of claim 21, wherein the skew of the second output signal further comprises a plurality of clock and data skews.

23. A system for testing a signal from a source, comprising:
   a device to generate a signal for testing;
   a test signal retiming circuit to receive the signal and generate a digital output thereto; wherein the test signal retiming circuit further comprises:
      a first capturing circuit for capturing an input signal to produce a first output signal in response to a first reference signal;
      a stabilizing circuit, coupled to the capturing circuit, for generating a second output signal in response to the first output signal and a second reference signal, wherein the second output signal is resistant to an input signal timing variation; and
      a verification circuit, coupled to the stabilizing circuit, for verifying that the second modified output signal appears at an output at a predetermined time.

24. The system of claim 23 wherein the capturing circuit further comprises a first buffer for acquiring the input signal, gating the input signal in response to a first reference signal and transferring the acquired input signal from the first buffer to a second buffer in response to the first reference signal.

25. The system of claim 24, wherein the first reference signal is generated by a system clock, wherein the system clock has a rising edge and a falling edge, the rising edge gating the input signal from the first buffer and the falling edge gating the input signal from the second buffer.

26. The system of claim 25, wherein the system clock further produces a timing signal for a component under test.

27. The system of claim 25, wherein the second buffer transfers the first output signal to the stabilizing circuit in response to a second reference signal to produce the second output signal.

28. The system of claim 27, wherein the second reference signal is a test clock, wherein the test clock has a rising edge for gating the first output signal from the stabilizing circuit to produce the second output signal.

29. The system of claim 28, wherein the test clock produces a timing signal to compare the second output thereto.

30. The system of claim 23, wherein the verification circuit further comprises a comparator circuit for comparing a predetermined signal to the second output signal to determine if the second output signal matches the predetermined signal.

31. The system of claim 30, wherein the comparator circuit compares the second output signal to the predetermined signal at a predetermined period.

32. The system of claim 31, wherein the second output signal comprises minimal skew.

33. The system of claim 32, wherein the skew of the second output signal further comprises a plurality of clock and data skews.

34. An article of manufacture for providing test signal retiming circuit, the article of manufacture comprising a computer readable medium having instructions for comparing testing a signal from a source comprising:
   capturing an input signal to produce a first output signal in response to a first reference signal;
   generating a second output signal in response to the first output signal and a second reference signal, wherein the second output signal is resistant to an input signal timing variation; and
   verifying the second output signal conforms to timing of a predetermined output signal.

* * * * *